United States Patent
Betting et al.

(10) Patent No.: US 8,524,318 B2
(45) Date of Patent: Sep. 3, 2013

(54) METHOD OF FORMING ICE-PHOBIC COATING

(75) Inventors: Marco Betting, Rijswijk (NL); Cornelis Antonie Tjeenk Willink, Rijswijk (NL); Zvonimir Opic, Rijswijk (NL); Swie Siang Sebastiaan Kwee, Rijswijk (NL)

(73) Assignee: Twister B.V. (NL)

( * ) Notice: Subject to any disclaimer, the term of this patent is extended or adjusted under 35 U.S.C. 154(b) by 129 days.

(21) Appl. No.: 12/995,150

(22) PCT Filed: May 27, 2009

(86) PCT No.: PCT/NL2009/050293
§ 371 (c)(1),
(2), (4) Date: Feb. 8, 2011

(87) PCT Pub. No.: WO2009/145627
PCT Pub. Date: Dec. 3, 2009

(65) Prior Publication Data
US 2011/0123736 A1    May 26, 2011

(30) Foreign Application Priority Data

May 28, 2008   (WO) ............... PCT/NL2008/050321
Oct. 10, 2008   (EP) ..................................... 08166360
Mar. 31, 2009   (EP) ..................................... 09156912

(51) Int. Cl.
*B05D 7/22* (2006.01)

(52) U.S. Cl.
CPC ...................................... *B05D 7/22* (2013.01)
USPC ........................................................ 427/230

(58) Field of Classification Search
CPC ......................................................... B05D 7/22
USPC .................................................. 427/230–239
See application file for complete search history.

(56) References Cited

U.S. PATENT DOCUMENTS

| | | | |
|---|---|---|---|
| 6,749,813 B1 * | 6/2004 | David et al. .................. | 422/502 |
| 2005/0065037 A1 | 3/2005 | Constien | |
| 2006/0272805 A1 | 12/2006 | O'Malley et al. | |
| 2008/0236842 A1 * | 10/2008 | Bhavsar et al. ............... | 166/381 |

FOREIGN PATENT DOCUMENTS

| | | |
|---|---|---|
| GB | 2 298 440 A | 9/1996 |
| WO | 00/01981 A1 | 1/2000 |
| WO | 03/029739 A2 | 4/2003 |

* cited by examiner

*Primary Examiner* — William Phillip Fletcher, III

(57) ABSTRACT

The present invention relates to a method for reducing gas hydrate adhesion to the interior surface of a conduit and associated equipment transporting or processing a fluid stream in oil and gas exploration and production, petroleum refining and/or petrochemistry, by providing the conduit interior surface with a coating layer exhibiting a static contact angle of the sessile water drop on the coating layer in air higher than 75° at ambient air conditions, as measured according to ASTM D7334-08, wherein said coating layer comprises diamond like carbon (DLC) comprising fractions of one or more components selected from the group consisting of silicon (Si), oxygen (O) and fluor (F).

9 Claims, 1 Drawing Sheet

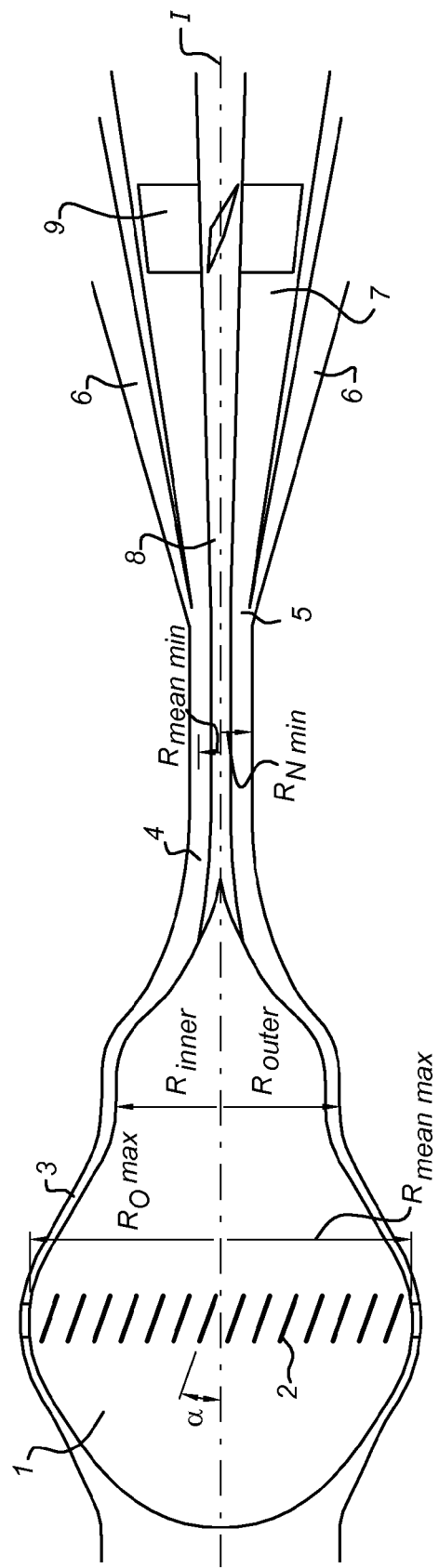

METHOD OF FORMING ICE-PHOBIC COATING

FIELD OF THE INVENTION

The invention rests in the field of oil and gas exploration and production, petroleum refining and petrochemistry, and pertains generally to the control of or influence over hydrate formation within conduits and the like, to improve or control flow characteristics, in particular hydrate formation in transporting and processing of water-containing hydrocarbon gases.

BACKGROUND OF THE INVENTION

Gas clathrate, also called gas hydrate or gas ice, is a solid form of water that contains a large amount of gas within its crystal structure. Such gas clathrates are found in formation fluids or natural gas, where hydrocarboneaous gas forms hydrates in conjunction with water. These hydrates usually exist in agglomerated solid forms that are essentially insoluble in the fluid itself.

Thermodynamic conditions favouring hydrocarboneaous gas hydrate formation are often found in pipelines, transfer lines or other conduits, valves and/or safety devices, vessels, heat exchangers etc. This is highly undesirable because the gas crystals might agglomerate and cause plugging or blockage of the flow-line, valves and instrumentation. This results in shutdown, loss of production, risk of explosion and injury or unintended release of hydrocarbons into the environment either on-land or off-shore. Accordingly, natural gas hydrates are of substantial interest as well as a concern to many industries, particularly the petroleum and natural gas industries.

Once formed, hydrates are difficult to decompose of, for instance by increasing the temperature and/or decreasing the pressure. WO-A-2007/055592 teaches a heat induction system for this purpose. However, at these conditions, the clathrate dissociation is a slow process. Therefore, preventing hydrate formation appears to be the key to the problem. Presently, hydrate formation may be often controlled by using chemicals, such as methanol, glycol, kinetic hydrate inhibitors or any other higher alcohol, and/or active heating. Remediation of a plugged conduit often employs some combination of active heating, chemicals and/or depressurization. The use of inhibition chemicals, depressurization and/or heaters may be logistically complex and expensive and may incur a certain amount of risk to field personnel. Above all, results are far from optimal.

US-A-2006/272805 suggests to impart energy to the mixture of gas and water, for instance using agitation or vibration. The hydrate particles continue to form as long as energy is imparted and water and hydrate guest molecules are available. High amplitude agitation of the gas and water will repeatedly break up agglomerated hydrate particles that form and encourage the formation of more and smaller particles. As more hydrate forms in this manner, less and less free water may be available proximate the gas and water contact. However, it is unclear how such an acoustic inhibitor would be enforceable in many of the applications where clathrates pose a problem.

Outside the field of gas clathrates, US-A-2005/065037 discloses coatings for well screens that protect the screens from damage as they are inserted into the wellbore and once in the well, release reactive materials to react with and degrade potentially plugging materials such as drill solids, fluid filtercakes, fluid loss additives, and drilling fluids. Apart from the fact that there is no hint in US-A-2005/065037 of the problem of clathrates, the polymeric coatings suggested therein for preventing solids deposition would even be of no use when dealing with the extreme problems of the clathrate "ice" crystals. One of the problems is that gas hydrates—once formed—form a new equilibrium with the water vapour phase, resulting in a lower water vapour pressure. As a consequence gas hydrates will further grow through deposition of the water vapour onto the hydrate surface.

It is thus an object of the invention to provide means for reducing or even avoiding the adhesion of gas hydrate to the interior surfaces of processing systems in hydrocarbons-containing gas streams that is not hindered by any of the aforementioned disadvantages, and can be readily applied to various conduits and parts thereof. It is also an object of the invention to prevent hydrate plugging in natural gas transport piping without requiring that the pressure integrity of the pipeline be compromised.

SUMMARY OF THE INVENTION

It is now found by the inventors that these objects can be achieved by applying an ice-phobic coating to the interior parts of the walls of the conduit in contact with the hydrocarboneaous flow, thus making it hard for solidified condensables and ice-like structures such as gas hydrates to attach and subsequently grow.

The "ice-phobic" properties of the coating are such that the coating layer prevents solidified condensables such as clathrates or gas crystals from attaching and growing on to the surface of the conduit. Such coating layer has to satisfy a number of conditions: 1) it provides a low adhesion strength between the coating surface and the clathrate, or for that matter, provides at least a high contact angle with the liquid phase from which the clathrates are formed; 2) it exhibits sufficiently high micro-hardness, preferably at least equal to the hardness of the base material (=substrate); 3) it shows little or no corrosion/erosion in time; and 4) it is chemically inert, in particular to the materials it makes contact with. Each of these properties will be outlined in the detailed section.

The ice phobic coating of the present invention is found particularly useful if applied in fluid separation assemblies such as described in WO03/029739, WO99/01194, WO2006/070019 and WO00/23757. Their contents is herein incorporated by reference. In said fluid separation assemblies, deposition of gas clathrates on the walls not only yields undesired pressure loss, but the presence of a gas clathrate layer also results in water vapour to be withdrawn from the fluid stream, thus disadvantageously shifting the balance towards the non-vapour phase, causing the hydrate to grow further. Although the coating may be applied at an earlier stage, it is found that the build-up of gas hydrates particularly arises near the liquid enriched outlet of the separators denoted above. Both the short residence time and the high fluid shear forces largely prevent significant deposition levels at an earlier stage i.e. the fluid expansion part. This embodiment will be detailed further below.

DETAILED DESCRIPTION OF THE INVENTION

In one aspect, the invention thus pertains to the use of an ice-phobic coating layer to reduce or even prevent gas hydrate adhesion to the interior surface of a conduit transporting or processing a fluid stream, in oil and gas exploration and production, petroleum refining and/or petrochemistry, wherein said ice-phobic coating layer is provided to the conduit interior surface, and wherein said coating layer:

a) exhibits sessile water drop contact angle of at least 75° at ambient air conditions, as measured according to ASTM D7334-08;
b) exhibits micro hardness of at least 200 HV (Vickers units) if exposed to fluid velocities lower than 50 m/s, as measured according to ASTM E384-08;
c) exhibits corrosion rate of less than 0.1 μm/year; and
d) is chemically inert.

Additionally or alternatively, the invention also pertains to a method for reducing adhesion of solidified condensables, said condensables preferably comprising or being gas hydrates, to the interior surface of a conduit and/or associated equipment transporting or processing a fluid stream in oil and gas exploration and production, petroleum refining and/or petrochemistry by providing the conduit interior surface with a coating layer, preferably having a micro roughness of Ra less than 0.5 μm, exhibiting a static contact angle of the sessile water drop on the coating layer in air higher than 75° at ambient air conditions, as measured according to ASTM D7334-08.

Also, the invention pertains to a method for transporting or processing a water-containing hydrocarbon fluid in a conduit or transport line, heat exchanger, separator or fractionator in oil and gas exploration and production, petroleum refining and/or petrochemistry at a temperature at or lower than the freezing or solidification temperature of said fluid, wherein the interior surface of said conduit, heat exchanger, separator or fractionator is provided with a coating layer (to reduce or even prevent adhesion of solidified condensables, said condensables preferably comprising or being gas hydrates, to the interior surface of said conduit, heat exchanger, separator or fractionator), preferably having a micro roughness of Ra less than 0.5 μm, exhibiting a static contact angle of the sessile water drop on the coating layer in air higher than 75° at ambient air conditions, as measured according to ASTM D7334-08.

In on embodiment, it is preferred that said coating layer comprises diamond like carbon (DLC) comprising fractions of one or more components selected from the group consisting of silicon (Si), oxygen (O) and fluor (F).

In a further embodiment, the coating layer preferably exhibits a difference in dynamic water contact angle of 30 degrees or less, preferably 25 degrees or less. The preferred dynamic contact angle properties of the coating layer are detailed further on in the specification.

In the above, "reduction of adhesion of solidified condensables, said condensables preferably comprising or being gas hydrates" stands for lowering of the adhesion force acting between the solidified condensables [gas hydrates] originating from a fluid and the surface of the device holding or conducting said fluid stream.

Contact Angle

The coating layer needs to provide for low adhesion between the coating surface and the surface of a hydrate or ice-like solid. This is reflected in the term "ice-phobic" coating. This functional behaviour may readily be determined by the skilled person using routine water contact angle experiments at ambient air conditions, specified in e.g. ASTM D7334-08. A high water contact angle exhibits a small surface contact area per unit water volume, hence a relative low adhesion force per unit clathrate formed from said water phase. For sake of completeness, an example of such a test will be given further below.

It is essential that the coating provides for a static sessile water drop coating layer-water contact angle in air higher than 75°, preferably higher than 80°, most preferably even higher than 85°. Such high initial contact angles under normal atmospheric conditions correspond to a satisfactory level of dewetting in case the measurements would have been performed in the hydrocarboneaous environment of the applications, involving methane at elevated pressure. High atmospheric contact angles according to the invention upon change to high pressure methane, result in de-wetting. The contrary was observed for lower contact angles: a change to a hydrocarbonaeous gaseous phase yields (partial) wetting, in line with theoretical considerations (Young's equation). The present invention provides for straightforward contact angle measurements at ambient air conditions which stand model for the less defined conditions implied with a natural gas stream, and thus make a perfect tool to determine the suitability of materials for the purpose of the invention.

With "ambient air" conditions it is understood a relative humidity in the range of 20-60% RH, at a temperature in the range of 20-25° C., and atmospheric pressure.

Hardness

Further, the coating layer needs to exhibit sufficiently high wear resistance, i.e. high micro hardness. In accordance with the present invention, the coating layer should have a micro hardness at least 200 HV (Vickers units), more preferably at least 300 HV, most preferably at least 400 HV, if exposed to low fluid velocities typically lower than 50 m/s. Additionally or alternatively, the coating layer has a micro hardness preferably higher than 1000 HV if exposed to high fluid velocities, typically higher than 100 m/s. These hardness values measured according to ASTM E384-08.

Most plastic and/or resin-based coatings do not satisfy the minimum required hardness of more than 200 HV. However, a suitable candidate are copolymers based on epoxy matrix wherein a silicone is dispersed. The silicone spreads along the epoxy matrix when the coating cures.

Corrosion Resistance

The coating layer, largely protecting metal alloys such as steel and steel alloys from making contact with hydrocarbonaeous fluids, needs to show little corrosion in time. The rate of corrosion should be less than 0.1 micrometer/year. This criterion may alternatively be expressed over other, shorter time periods. Alternatively, the coating layer may exhibit a corrosion rate less than 0.008 μm/month, or 0.0019 μm/week. The extent or rate of corrosion is preferably determined by salt spray corrosion tests according to ASTM B 117.

Chemically Inert

The coating layer or the materials contained therein are chemically inert to the fluids making contact with it. Thus, it is chemically inert to alkanes, alkenes, alkynes, aromatic hydrocarbons, halogenated hydrocarbons, alcohols, hydrogen, carbon dioxide, hydrogen sulphide, mercaptans, mercury, and combinations thereof.

Based on the four preceding criterions the skilled person can readily select a suitable coating layer.

Further, it is preferred that the coating has a high adhesion reduction factor (ARF), which is defined as F_alu/F_coating, wherein F_alu corresponds to the force required to shear off the ice mass from an uncoated aluminium surface, as a reference. The values for F_alu and F_coating can be readily derived from a Centrifugal Adhesion Test (CAT). Details of such a test are given in the examples.

The ARF value is indicative for the desired gas clathrate adhesion prohibiting properties of the coating. The ARF should be at least equal to or larger than 1.5 though preferably equal to or larger than 2, more preferably equal to or larger than 3.

It was found that a good indication of the ARF can also be obtained from the hysteresis as derived from dynamic contact angle measurements, using the same conditions as taught for the static sessile drop contact angle measurements above. 'Hysteresis' corresponds to the difference between the advancing and receding angle. The advancing angle is the largest contact angle possible without increasing its solid/liquid interfacial area by adding volume dynamically. Correspondingly, the receding angle stands for the smallest possible angle when reducing volume. Hence, simple sessile drop measurements serve as an alternative to the Centrifugal Adhesion Test. It was found the above desired ARF values correspond to a difference between the advancing and receding contact angle in atmospheric conditions equal to or less than 30 degrees, preferably at most 25 degrees, preferably equal to or less than 20 degrees, particularly at most 15 degrees.

It was further found that coating materials with a relative high Poisson's ratio decrease the adhesion strength between water ice and the coating layer i.e. increase the ARF. Poisson's ratio is the ratio of transverse contraction strain to longitudinal extension strain in the direction of stretching force. Tensile deformation is considered positive and compressive deformation is considered negative. The definition of Poisson's ratio contains a minus sign so that normal materials have a positive ratio. Materials which are known to have very high ARF values are PTFE (Teflon) with an ARF=7 and epoxy-silicone coatings with an ARF=12. Both coating materials have a Poisson's ratio close to that of rubber, i.e. larger than 0.45. In order to obtain the desired ARF values mentioned above, the preferred coating has a Poisson's ratio equal to or larger than 0.4, more preferably larger than 0.45.

It is preferred that the coating maintains the above properties when exposed to a pressure in the range of 0-300 bar; when subjected to decompression of 100 to 1 bar in less than 60 seconds, in accordance with test specifications of EN 10301; at a temperature in the range of −120-120° C.; and/or pH ranging from 2 to 10.

Within the field of oil and gas exploration and production, petroleum refining and petrochemistry, the invention is generally directed to the prevention of clathrate deposits in the interior of conduits or transport lines, including piping and associated equipment, e.g. spools, valves, passage ways of valve internal, heat exchangers, separators, fractionators, especially those conduits, turbines, vessels and tanks etc. involving gas and oil recovery and fluid streams emerging from a natural gas production well, before distributing the gas into a network of pipelines. It includes, but is not necessarily limited to wellbores, annuli, pipes, pipelines, tubes, umbilicals, ducts, channels, columns and the like.

The invention particularly pertains to the prevention of gas hydrates in a fluid stream, preferably a natural gas stream. The main components of natural gas are hydrocarbons, but it includes non-hydrocarbons, such as carbon dioxide and hydrogen sulphide, also known to form hydrates. The principal hydrocarbon is methane. Other constituents are ethane, propane, butane, pentane, hexane, heptane etc. Inherent to the problem of clathrate formation, the fluid stream also contains condensable amounts of water vapour, preferably in the range of 10-2000 ppm.

In use, it is preferred that the water-containing hydrocarbon fluid, transported or processed in the conduit in accordance with the present invention, is in thermal equilibrium with the material of said conduit, and that the temperature is at or lower than the freezing or solidification temperature of the water-containing hydrocarbon fluid.

The term "gas hydrates" as used herein should be understood to include natural gas or hydrocarbon hydrates, but may also cover gas hydrates formed around molecules other than those found in natural gas. As discussed previously, the clathrates are cage structures formed between a host molecule and a guest molecule. The formation and decomposition of clathrate hydrates are first order phase transitions, not chemical reactions. A hydrocarbon hydrate generally may be composed of crystals formed by host water molecules that surround the gas or hydrocarbon guest molecules.

Throughout the description, the wording "gas hydrate", "clathrate" and "gas crystal" have similar meaning and are used interchangeably. The gas hydrates of the invention particularly comprise the smaller or lower-boiling hydrocarbon molecules, particularly C1 (methane) to C4 hydrocarbons and their mixtures, because it is believed that their hydrate or gas crystals are easier to form. In its broadest definition, the term gas hydrate also encompasses the non-hydrocarbons selected from the group consisting of carbon dioxide, nitrogen, oxygen and hydrogen sulphide. Several of these non-hydrocarbons, such as carbon dioxide, nitrogen and hydrogen sulphide, are known to exist in produced hydrocarbon fluids and therefore present an added risk of hydrate formation.

In one embodiment, the coating layer preferably comprises or is preferably formed from diamond-like carbon (DLC), preferably a fluorinated diamond-like-carbon [F-DLC] and/or an ceramic composition. The most preferred coating layer comprises DLC, preferably comprising fractions of one or more components selected from the group consisting of silicon (Si), oxygen (O) and fluor (F). In one embodiment, the coating layer of the invention contains predominant amounts, preferably more than 60 wt %, more preferably more than 80 wt %, most preferably more than 90 wt % of DLC. The weight-expressed numbers are based on the total weight of the coating layer. An example is DLN-360, commercially available with Bekaert (Belgium).

Other suitable coatings comprise one or more materials selected from the group consisting of metal alloys or metal carbides and/or nitrides.

The metal in the metallic carbides and/or nitrides is preferably a transition metal of the group consisting of tungsten, titanium, tantalum, molybdenum, zirconium, hafnium, vanadium, niobium, chromium, mixtures and solid solutions thereof.

Preferred examples of metal nitrides are CrN, $Cr_2N$, ZrN, TiN, and preferred metal carbides comprise CrC, TiC, WC. Combinations are also included. The coating may also comprise mixtures of transition metal carbides and/or nitrides with Group VIII metal, such as iron, cobalt nickel, as is taught in U.S. Pat. No. 5,746,803. Its contents is herein incorporated by reference.

In one embodiment, the coating layer contains epoxy-silicone copolymer, preferably in predominant amounts. An example of a commercial available epoxy-silicone coating is Wearlon®, manufactured by Plastic Maritime Corporation, USA or Ecological Coatings, LLC also in the USA. Said copolymer coatings exhibit a static water contact angle of typically >99° and represent low ice-adhesion strength. It will be understood that the hardness of said coating depends on the fraction of silicon used, the curing agent, the curing temperature and curing time.

It is preferred that the coated interior surface of the conduit has a micro roughness of Ra less than 0.5 μm, more preferably 0.1-0.5 μm. These numbers may be achieved using micro blasting, preferably using aluminium oxide particles, preferably having a diameter of less than 50 micron. In one embodiment, it is preferred that the surface roughness of the coating (and underlying surface) is less than 0.05 micrometer, more preferably less than 0.02 micron, in all directions.

The invention especially concerns those parts involved before or in dehydrating or degassing of fluid streams, or wherein the processing of a fluid stream comprises dehydrating or degassing, so called separators and fractionators. For reasons outlined above, it is very advantageous to incorporate a coating layer according to the present invention in these high-demanding environments.

In the most preferred embodiment, the coating is applied in a cyclonic fluid separator. Referring to WO03/029739A2, its contents hereby incorporated by reference, a cyclonic fluid separator comprises a tubular throat portion in which a fluid stream is accelerated to a possibly supersonic speed and rapidly cooled down as a result of adiabatic expansion. The rapid cooling will cause condensation and/or solidification of condensables in the fluid stream into small droplets or particles.

The separator furthermore preferably comprises an assembly of swirl imparting vanes in an inlet portion upstream of the throat portion, which vane or vanes are tilted or form a helix relative to a central axis of the throat portion to create a swirling motion of the fluid stream within the separator. The centrifugal forces exerted by the swirling motion on the fluid mixture will induce the relatively high density condensed and/or solidified condensables to swirl to the outer periphery of the interior of the throat portion and of a diverging outlet section whereas relatively low density gaseous components are concentrated near the central axis of the separator.

The gaseous components are subsequently discharged from the separator through a primary central outlet conduit, whereas the condensates enriched fluid stream is discharged from the separator through a secondary outlet which is located at the outer circumference of the diverging outlet section. The coating layer finds particular use if applied near the primary central outlet conduit and/or the secondary outlet, since both are troubled by clathrate deposition. High velocity conditions at earlier stages of the separator largely prevent gas crystals from forming.

A more detailed description of a cyclonic fluid separator is described below with reference to FIG. 1. FIG. 1 schematically depicts a longitudinal sectional view of a cyclonic separator. This embodiment will now be described, by way of example only, with reference to the accompanying schematic drawing of FIG. 1, in which corresponding reference symbols indicate corresponding parts.

Referring now to FIG. 1, there is shown a cyclonic inertia separator which comprises a swirl inlet device comprising a pear-shaped central body 1 on which a series of swirl imparting vanes 2 are mounted and which is arranged coaxial to a central axis I of the separator and inside the separator housing such that an annular flow path 3 is created between the central body 1 and separator housing.

The separator further comprises a tubular throat portion 4 from which, in use, the swirling fluid stream is discharged into a diverging fluid separation chamber 5 which is equipped with a central primary outlet conduit 7 for gaseous components and with an outer secondary outlet conduit 6 for condensables enriched fluid components. The central body 1 has a substantially cylindrical elongate tail section 8 on which an assembly of flow straightening blades 9 is mounted. The central body 1 has a largest outer width or diameter $2R_{o,max}$ which is larger than the smallest inner width or diameter $2R_{n,min}$ of the tubular throat portion 4.

The various components of the cyclonic fluid separator as shown in FIG. 1 are described below.

The swirl imparting vanes 2 which are oriented at an angle ($\alpha$) relative to the central axis I create a circulation ($\Gamma$) in the fluid stream. The angle $\alpha$ may be between 20° and 30°. The fluid stream is subsequently induced to flow into the annular flow area 3. The cross-sectional surface of this area is defined as:

$$A_{annulus} = \pi(R_{outer}^2 - R_{inner}^2)$$

The latter two being the outer radius and inner radius of the annulus at a selected location. The mean radius of the annulus at that location is defined as:

$$R_{mean} = \sqrt{[\tfrac{1}{2}(R_{outer}^2 + R_{inner}^2)]}.$$

At the maximum value of the mean annulus radius $R_{mean,max}$ the fluid stream is flowing between the assembly of swirl imparting vanes 2 at a velocity (U), which vanes deflect the flow direction of the fluid stream proportional to the deflection angle ($\alpha$) and so obtaining a tangential velocity component which equals $U_\phi = U \cdot \sin(\alpha)$ and an axial velocity component $U_x = U \cdot \cos(\alpha)$.

In the annular space 3 downstream of the swirl imparting vanes 2 the swirling fluid stream is expanded to high velocities, wherein the mean annulus radius is gradually decreasing from $R_{mean,max}$ to $R_{mean,min}$.

It is considered that during this annular expansion two processes occur:

(1) The heat or enthalpy in the flow (h) decreases with the amount $\Delta h = -\tfrac{1}{2}U^2$, thereby condensing those flow constituents which first reach phase equilibrium. This results in a swirling mist flow containing small liquid or solid particles.

(2) The tangential velocity component increases inversely with the mean annulus radius $U_\phi$ substantially in accordance with the equation $$U_{\phi,final} = U_{\phi,initial} \cdot (R_{mean,max}/R_{mean,min}).$$

This results in a strong increase of the centrifugal acceleration of the fluid particles ($a_c$), which will finally be in the order of:

$$a_c = (U_{\phi,final}^2 / R_{mean,min}).$$

In the tubular throat portion 4 the fluid stream may be induced to further expand to higher velocity or be kept at a substantially constant speed. In the first case condensation is ongoing and particles will gain mass. In the latter case condensation is about to stop after a defined relaxation time. In both cases the centrifugal action causes the particles to drift to the outer circumference of the flow area adjacent to the inner wall of the separator housing, which is called the separation area. The time period for the particles to drift to this outer circumference of the flow area determines the length of the tubular throat portion 4.

Downstream of the tubular throat portion 4 the condensables enriched 'wet' fluid components tend to concentrate adjacent to the inner surface of the diverging fluid separation chamber 5 and the 'dry' gaseous fluid components are concentrated at or near the central axis I, whereupon the wet condensables enriched 'wet' fluid components are discharged into an outer secondary fluid outlet 6 via a (series of) slot(s), (micro) porous portions whereas the 'dry' gaseous components are discharged into the central primary fluid outlet conduit 7.

In the diverging primary fluid outlet conduit 7 the fluid stream is further decelerated so that the remaining kinetic energy is transformed into potential energy.

The diverging primary outlet conduit may be equipped with an assembly of flow straightening vanes 9 to recover the circulation energy.

It is preferred to provide the interior of the separator from separation chamber 5 onwards with a coating layer according to the present invention.

The descriptions above are intended to be illustrative, not limiting. Thus, it will be apparent to one skilled in the art that modifications may be made to the invention as described without departing from the scope of the claims set out below.

EXAMPLES

Example 1

Coating Layer

The surface of a metal test part was coated with a 3 micrometer thick layer containing >90% w/w DLC, commercially available as DLN-360 (origin: Bekaert, Belgium under the brand name Dylyn®-DLC).

The following properties of said DLN 360 coating were determined using known techniques:

- Water contact angle: 87° (sessile drop) [ASTM D7334-08; ambient conditions]
- Hardness: 3000 HV [ASTM E384-08]
- Corrosion rate: <0.1 μm/yr [ASTM B 117]
- Ice adhesion strength: 0.233 MPa (+/−8%)
- Adhesion reduction ARF: 2 (compared to bare aluminium surface)

The ice adhesion strength was determined in a test method called: Centrifugal Adhesion Test (CAT). Thereto, an impeller was coated at one impeller tip with the DLC coating over a surface of 1152 mm$^2$. The coated surface was cooled down to −5° C., where after a water ice-like layer built up by depositing a water fog on to the coated surface, resulting in an ice thickness of typically 8 mm over said surface of 1152 mm$^2$. The impeller was balanced by a counter weight mounted on the other impeller tip. The impeller was then mounted on a shaft in a centrifuge chamber which was conditioned at −10° C. and at atmospheric pressure. On the outer wall of the centrifuge accelerometers were mounted which could detect the impact of an object colliding to said centrifuge wall. The rotational speed of the impeller was gradually increased with about 270 rpm/sec up to the point that ice-like mass detached from the impeller tip. The point in time at which the ice-like mass released from the tip surface was detected almost instantly by the accelerometers attached at the centrifuge wall. When the pulsed signal of the accelerometer was detected, the actual rpm value of the impeller was fixed. From 1) final fixed rpm value, 2) the radial distance between the mass centre point of ice and axis of rotation, 3) the ice mass and 4) the air shear force, the critical shear between ice and coating surface at which detachment occurs, was determined. The latter is referred to as ice adhesion strength (F). The adhesion reduction factor (ARF) is defined as F_alu/F_coating, wherein F_alu corresponds to the force required to shear off the ice mass from the uncoated aluminium surface.

The ARF value is indicative for the desired gas clathrate adhesion prohibiting properties of the coating. The ARF should be at least equal to or larger than 1.5 though preferably equal to or larger than 2, more preferably equal to or larger than 3.

The invention claimed is:

1. A method for reducing the adhesion of solidified condensables to the interior surface of a conduit and/or associated equipment transporting or processing a fluid stream in oil and gas exploration and production, petroleum refining and/or petrochemistry, said associated equipment being spools, valves, passage ways of valve internal, heat exchangers, separators, fractionators, turbines, vessels, tanks, wellbores, annuli, pipes, pipelines, tubes, umbilicals, ducts, channels and columns, by providing the conduit interior surface with a coating layer exhibiting a static contact angle of the sessile water drop on the coating layer in air higher than 75° at ambient air conditions, as measured according to ASTM D7334-08, wherein said coating layer comprises diamond like carbon (DLC) comprising fractions of one or more components selected from the group consisting of silicon (Si), oxygen (O) and fluor (F), and wherein said DLC coating is a fluorinated DLC.

2. The method according to claim 1, wherein said solidified condensables comprise gas hydrates.

3. The method according to claim 1, wherein said fluid stream is a natural gas stream.

4. The method according to claim 1, wherein said coating layer exhibits an adhesion reduction factor equal to or greater than 1.5, preferably equal to or greater than 3.

5. The method according to claim 1, wherein said coating layer exhibits a difference between the advancing and receding water drop contact angle at atmospheric conditions of 30 degrees or less, preferably 25 degrees or less.

6. The method according to claim 1, in which said coated interior surface has a micro roughness of Ra less than 0.5 μm.

7. The method according to claim 1, wherein said coating layer has a Poisson's ratio equal to or larger than 0.4.

8. The method according to claim 1, wherein the processing of a fluid stream comprises dehydrating or degassing a fluid stream.

9. The method according to claim 1, wherein said conduit is a cyclonic fluid separator.

* * * * *